United States Patent
Bernstein et al.

(10) Patent No.: US 6,453,431 B1
(45) Date of Patent: Sep. 17, 2002

(54) SYSTEM TECHNIQUE FOR DETECTING SOFT ERRORS IN STATICALLY COUPLED CMOS LOGIC

(75) Inventors: Kerry Bernstein, Underhill; Andres Bryant, Essex Junction; William A. Klaasen, Underhill; Wilbur David Pricer, Charlotte, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/346,509

(22) Filed: Jul. 1, 1999

(51) Int. Cl.7 .......................... G06K 5/04; G11B 20/20; G11B 5/00; G06F 11/00; H03M 13/00
(52) U.S. Cl. ........................................ 714/700; 714/815
(58) Field of Search ................................. 714/700, 815

(56) References Cited

U.S. PATENT DOCUMENTS

| | | | |
|---|---|---|---|
| 3,895,349 A | | 7/1975 | Robson |
| 4,293,930 A | | 10/1981 | Van Reymersdal |
| 4,404,673 A | | 9/1983 | Yamanouchi |
| 4,495,629 A | | 1/1985 | Zasio et al. |
| 4,581,741 A | | 4/1986 | Huffman et al. |
| 4,637,018 A | * | 1/1987 | Flora et al. .................. 714/700 |
| 4,700,347 A | * | 10/1987 | Rettberg et al. ............. 714/700 |
| 4,737,971 A | * | 4/1988 | Lanzafame et al. ......... 714/700 |
| 4,800,564 A | | 1/1989 | DeFazio et al. |
| 4,868,420 A | | 9/1989 | Itoh et al. |
| 5,032,743 A | * | 7/1991 | Rogers ......................... 326/30 |
| 5,043,990 A | | 8/1991 | Doi et al. |
| 5,233,617 A | * | 8/1993 | Simmons et al. ............ 714/814 |
| 5,313,501 A | * | 5/1994 | Thacker ....................... 375/369 |
| 5,410,550 A | * | 4/1995 | Simmons et al. .............. 327/3 |
| 5,497,475 A | | 3/1996 | Alapat |
| 5,508,634 A | | 4/1996 | Sugiyama |
| 5,619,148 A | * | 4/1997 | Guo ............................ 714/814 |
| 5,802,266 A | | 9/1998 | Kanekawa et al. |

FOREIGN PATENT DOCUMENTS

JP 07058736 A * 3/1995 ............. H04L/7/33

* cited by examiner

*Primary Examiner*—Albert Decady
*Assistant Examiner*—Joseph D. Torres
(74) *Attorney, Agent, or Firm*—Whitham, Curtis & Christofferson, P.C.; Mark F. Chadurjian

(57) ABSTRACT

Circuit for detecting error transients in logic circuits due to atomic events or other non-recurring noise sources includes a first circuit coupled to a data line for sensing a first signal on the data line at a first point in time (T1) and a second circuit coupled to the data line for sensing the first signal on the data line at a second point in time (T2) such that a time difference between T1 and T2 is small enough so that the first signal is still present on the data line in the absence of a perturbation event and such that the time difference between T1 and T2 is large enough so that any such perturbation event is resolved. A compare circuit coupled to the first and second circuits compares the sensing of the first signal by the first and second circuits, and generates an error signal in response to a non-compare.

12 Claims, 7 Drawing Sheets

SYSTEM TECHNIQUE FOR DETECTING SOFT ERRORS IN STATICALLY COUPLED CMOS LOGIC

BACKGROUND OF THE INVENTION

1. Field of the Invention

The present invention relates to circuits for detecting error transients in logic circuits due to atomic events or other non-recurring noise transients.

2. Background Description

Statically (DC) coupled Complementary Metal Oxide Semiconductor (CMOS) logic has been employed in the vast majority of logic applications for the last fifteen years. It has enjoyed this pre-eminence as a result of an unusually broad set of highly desirable features including very low power consumption, high performance and rugged resistance to external noise sources. Until very recently this has included absolute resistance to atomic events like the emission of alpha particles from near proximity metals and the incidence of cosmic rays from just about anywhere.

Rapid advances in lithography have allowed circuit node features to shrink in area about a factor of two every two years. Node capacitance has shrunken almost as fast. With the advent of 0.2 micron lithography, small lightly loaded nodes are vulnerable to error transients. The vulnerability of the computation is a more complex matter. To actually corrupt the computation, the atomic event, whether alpha or cosmic in origin, must impinge on one of these lightly loaded nodes within a time window such that the error transient is likely to be latched into a register. Error transients which are too short to propagate to the next latch or which occur in plenty of time for the logic levels to recover after the transient will not be captured by the latches. As lithography features shrink further, more and more of these error transients will impinge upon vulnerable nodes and be captured as bona-fide soft errors.

Earlier work fails to correct the problem. The atomic event induced soft error problem was first detected and eventually corrected in memory. Small Static Random Access Memory (SRAM) and Dynamic Random Access Memory (DRAM) cells have inherently small lightly loaded circuit nodes and thus exhibited early vulnerability to this problem. The problems of detection and ultimately correction were solved in a straight forward manner using parity for error detection and multidimensional parity with error correction codes. This early success lead to much research in an effort to extend code detection to logic. Researchers today agree this approach has failed. The codes devised are simply too complex and too specialized for implementation in general purpose logic.

A brute force solution is unattractive. We could, of course, simply pad all vulnerable circuit nodes with extra capacitance. This "solution" stands in direct opposition to one of the principle motivations of finer lithography. That is to improve circuit and system performance. In the last three technology generations, the effective transconductance at nominal power supply has not changed significantly; rather, improved performance has been largely achieved by lowering node capacitance and decreasing nominal power supply. Both factors increase node vulnerability. Charge or discharge transients from atomic events can vary tremendously. However, a given event appears as a fixed charge or discharge on the affected node, independent of the node size or voltage.

SUMMARY OF THE INVENTION

According to the invention, there is provided a first circuit coupled to a data line for sensing a first signal on the data line at a first point in time (T1) and a second circuit coupled to the data line for sensing the first signal on the data line at a second point in time (T2) such that a time difference between T1 and T2 is small enough so that the first signal is still present on the data line in the absence of a perturbation event and such that the time difference between T1 and T2 is large enough so that any such perturbation event is resolved. A compare circuit coupled to the first and second circuits compares the sensing of the first signal by the first and second circuits, and generates an error signal in response to a non-compare.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
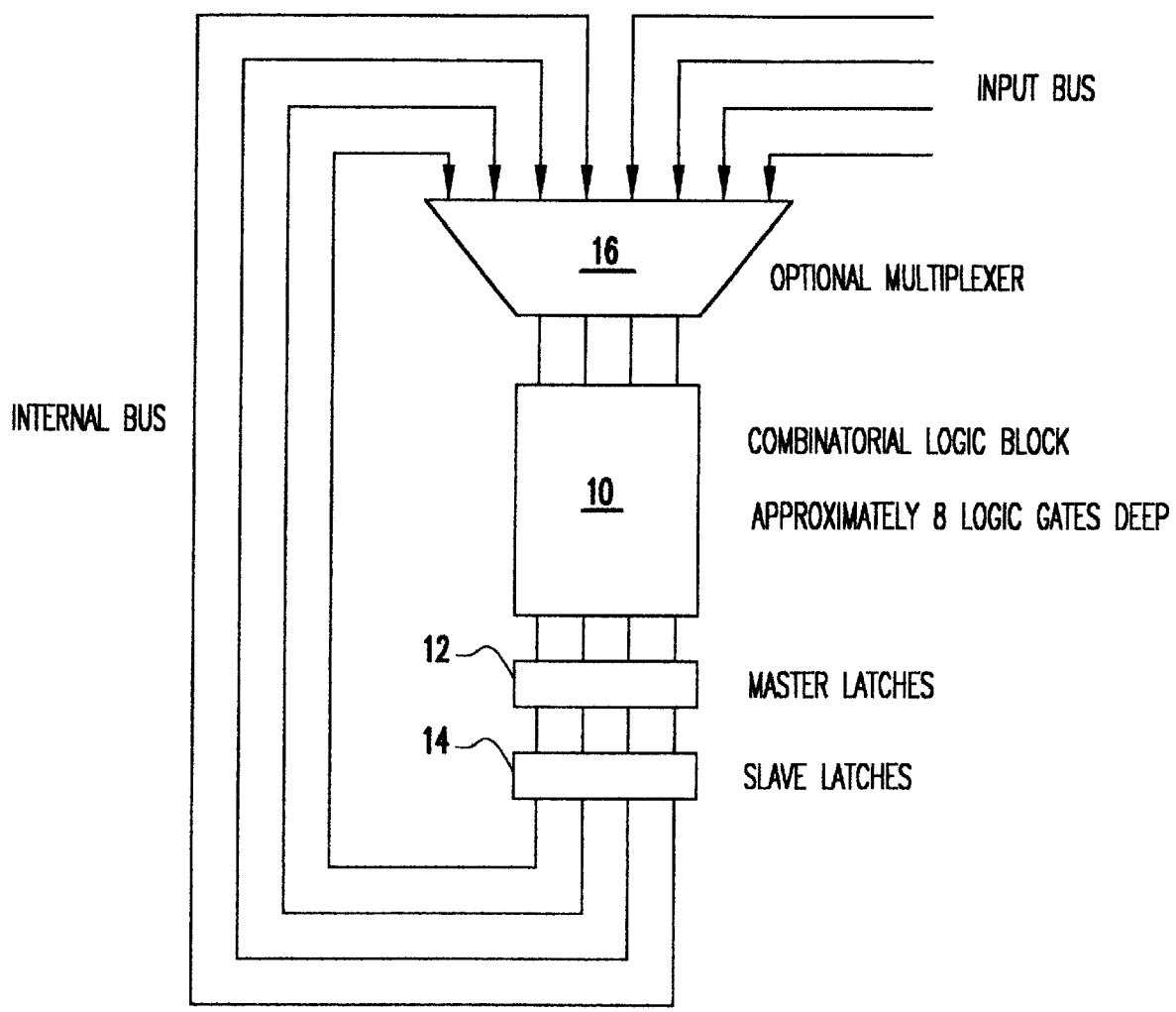
FIG. 1 is a block diagram of a simplified logic system which illustrates the problem of the prior art.

Referring now to the drawings, and more particularly to FIG. 1, there is shown a simplified logic system represented by a typical combinatorial logic block 10 of about eight stages followed by a master and slave set of latches (registers) 12 and 14. In this example, results of previous calculations are recirculated and combined with new data for subsequent calculations in multiplexer 16. A transient error at a vulnerable node during a critical time window is captured by a master latch 12 and subsequently fed to a slave latch 14. The erroneous data then is constantly recirculated through the logic block corrupting all future calculations.

Figure 2:
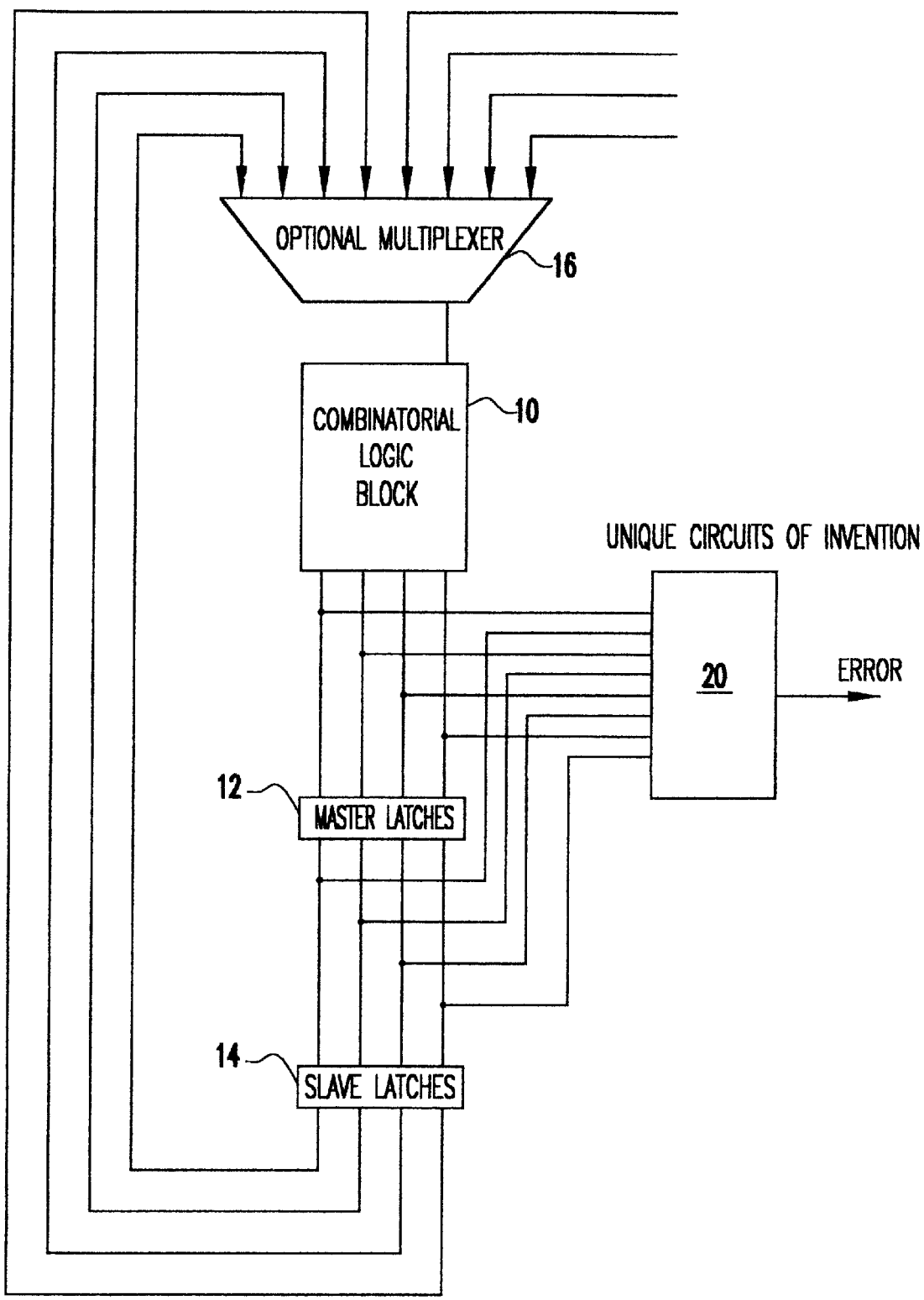
FIG. 2 is a block diagram of the logic system of FIG. 1 modified to include the present invention.

FIG. 2 shows this same simplified logic system of FIG. 1 modified to include the invention. In particular, the unique circuits of this invention are illustrated in general block form as block 20. These circuits, described in more detail with reference to FIG. 3 below, are connected to outputs of the combinatorial logic block 10 and outputs of the master latches 12. The circuits in block 20 comprise a first circuit coupled to a data line of the combinatorial logic 10 for sensing a first signal on the data line at a first point in time (T1) and a second circuit coupled to the corresponding data line of the master latches for sensing the first signal on the data line at a second point in time (T2) such that a time difference between T1 and T2 is small enough so that the first signal is still present on the data line in the absence of a perturbation event and such that the time difference between T1 and T2 is large enough so that any such perturbation event is resolved. The outputs of the first and second circuits are input to a compare circuit for comparing the sensing of the first signal by the first and second circuits, and for generating an error signal in response to a non-compare. No node capacitance has been increased in any significant manner. Further, no additional logic has been added in series with the signal path. Nor has the clock frequency been lowered. Thus our solution does not effect system performance in any significant way. In this example, the invention is illustrated as a circuit for detecting error transients in logic circuits. It is noted that error transients may include other transients such as voltage, current, phase or frequency transients and the application of the invention is not limited to logic circuits but may be applicable to any circuit including analog, digital, memory circuits and the like.

Figure 3:
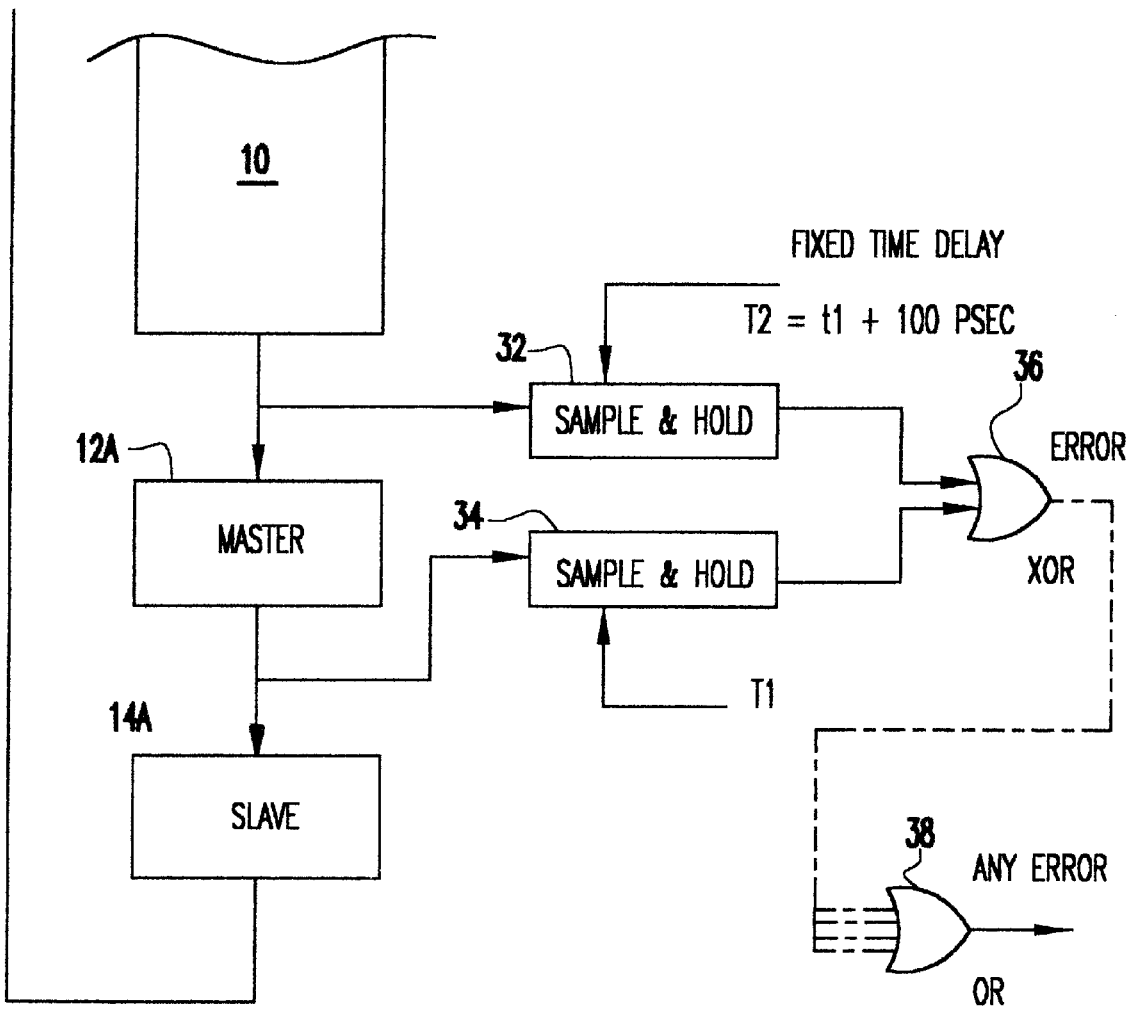
FIG. 3 is a block and logic diagram of a single master and slave pair with sample and hold circuits according to the teaching of the invention.
Figure 4A:
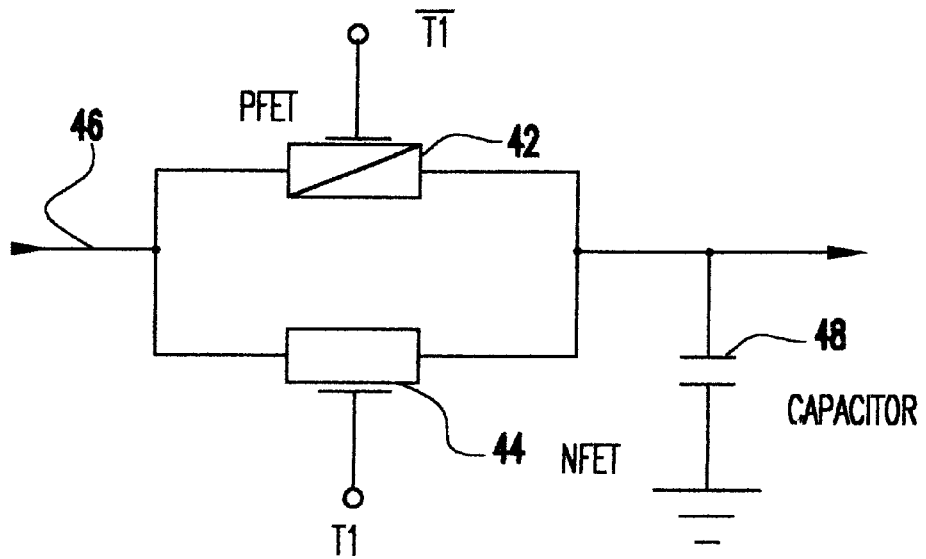
FIGS. 4A and 4B are, respectively, a circuit diagram and a block diagram of examples of sample and hold circuits suitable to the practice of the invention.
Figure 4B:
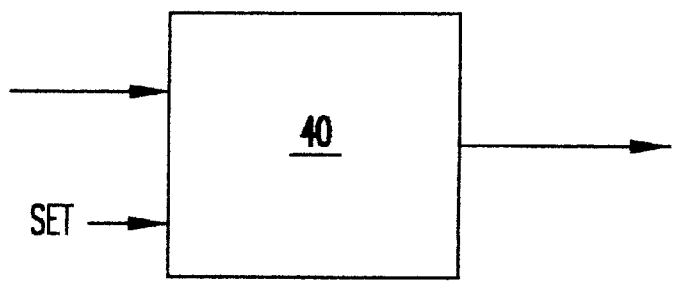

FIG. 3 shows a single master and slave latch pair 12a and 14a, along with "sample and hold" circuits 32 and 34. The actual circuit embodiment may be a traditional (analog) sample and hold circuit, or a digital equivalent. FIGS. 4A and 4B show two examples of sample and hold circuits which may be used in the practice of the invention. FIG. 4A is an example of an analog sample and hold circuit comprising a p-type field effect transistor (PFET) 42 connected in parallel with an n-type field effect transistor (NFET) 44. The gates of PFET 42 and NFET 44 are both controlled by a sampling pulse T1 to pass an input signal at input node 46 to a storage capacitor 48. FIG. 4B is an example of a digital sample and hold circuit comprising a D-type flip-flop 40.

Referring back to FIG. 3, the sample and hold circuits 32 and 34 sample and hold the contents of the master latch 12 and the input signal to the master latch at a fixed time delay after the master latch ceases to actively monitor (and follow) its own input. This fixed time delay is critical to the proper function of the invention. The outputs of sample and hold circuits 32 and 34 are input to an exclusive OR (XOR) circuit 36 which compares the two inputs and generates an error signal if there is no compare between the two signals. This pattern is repeated for each data line, and the outputs of all XOR circuits are input to an OR gate 38 which logically sums the XOR outputs and produces an error output if any one of the XOR circuits generates an error signal.

The infrequent, transitory and unpredictable nature of these events make them difficult to measure and statistically characterize. However, our modeling is believed to be representative of their true nature. Present models predict transients of 20 to 100 femtocoulombs over 10 to 100 picoseconds. The exact charge depends on the origins and energy of the event, angle of incidence and the collection tail. To a lesser extent the charge can also depend on the technology.

The transconductance of present and future technology is expected to be able to drain away the total incident charge of the event within the maximum time period of the longest event (100 psec); a given MOSFET (Metal Oxide Semiconductor Field Effect Transistor) device is incapable, however, of sinking the current necessary to prevent a logic level transient during the event. Thus, an event will appear as a transient logic level pulse of up to 100 psec duration. The fixed time delay of FIG. 3 is set equal to this "maximum transient error pulse width" or about 100 psec.

If a soft error transient occurs in any part of the combinatorial logic 10 and it is captured by the master latch 12, the input to master latch will have recovered to its true logic level, after the fixed logic delay. Thus, the invention will detect a difference between the contents of the two sample and hold circuits 32 and 34 and report the occurrence of a soft error.

The invention errs by over-reporting errors. If a soft error transient occurs in any part of the combinatorial logic 10 but is too late to be captured by the master latch 12 but soon enough to be captured by the sample and hold circuits 32 and 34, the invention will detect the difference and report it as a soft error even though the contents of the master latch 12 have not been corrupted.

The probability of two atomic event driven soft errors within a single system cycle is considered too remote to be of interest. A 500 MHz (megaHertz) system which experienced, on average, a soft error every ten hours, could expect two coincident errors every 2,000,000 years. The invention thus guards well against soft errors generated anywhere within the combinatorial logic block 10.

Errors within the master 12 or slave 14 latch portions require closer inspection. The invention is designed to detect transitory errors. The scheme works because any soft error transient originating from within the combinatorial block should be completely spent within 100 psec or so. Thus, the computational result captured by the master latch can be compared with the input to that same latch a mere 100 psec later. On the other hand, soft errors induced by atomic events directly into the latches can remain for longer periods.

The straight forward solution is to design the latches and only the latches to be soft error resistant. In frequent occurrences, these latches drive buses, are therefore already heavily loaded, and thus should be expected to be naturally soft error resistant.

Figure 5A:
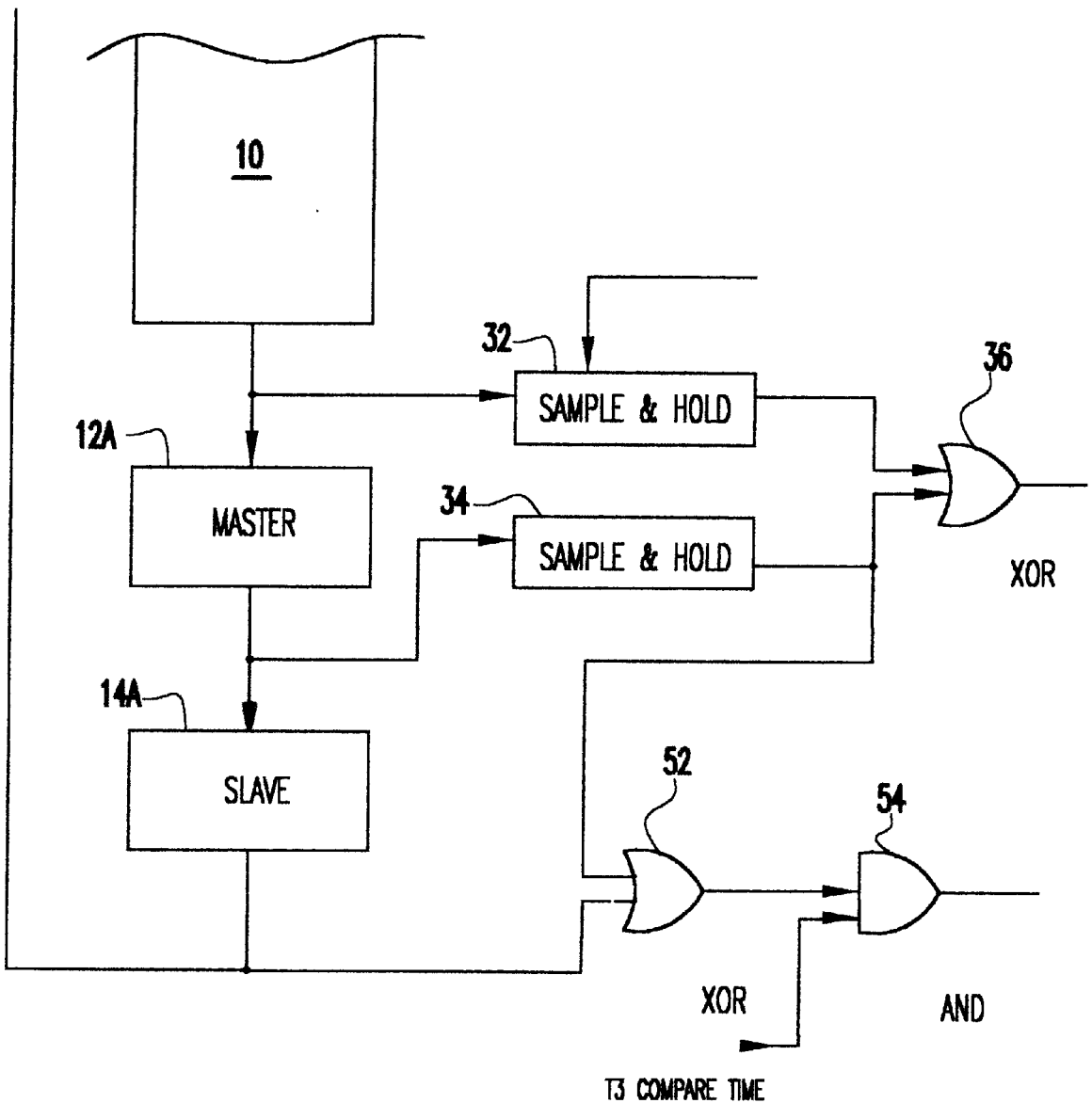
FIGS. 5A and 5B are block and logic diagrams similar to FIG. 3 showing an extension of the invention to included slave latches.

An alternate solution is to extend the concept of the invention to the slave latches 14 as shown in FIG. 5A. In this illustration, the sampled input to the master latch 12a is compared twice. First, it is compared by XOR circuit 36 to the contents of the master latch for a brief time period starting about 100 psec after the master latch is set. Second, it is compared by XOR circuit 52 to the contents of the slave latch 14a for a later much longer time duration (T3) while the slave latch is driving the combinatorial block 10 at AND gate 54. Thus, any transition in the state of the slave latch when they should be static is detected.

Figure 5B:
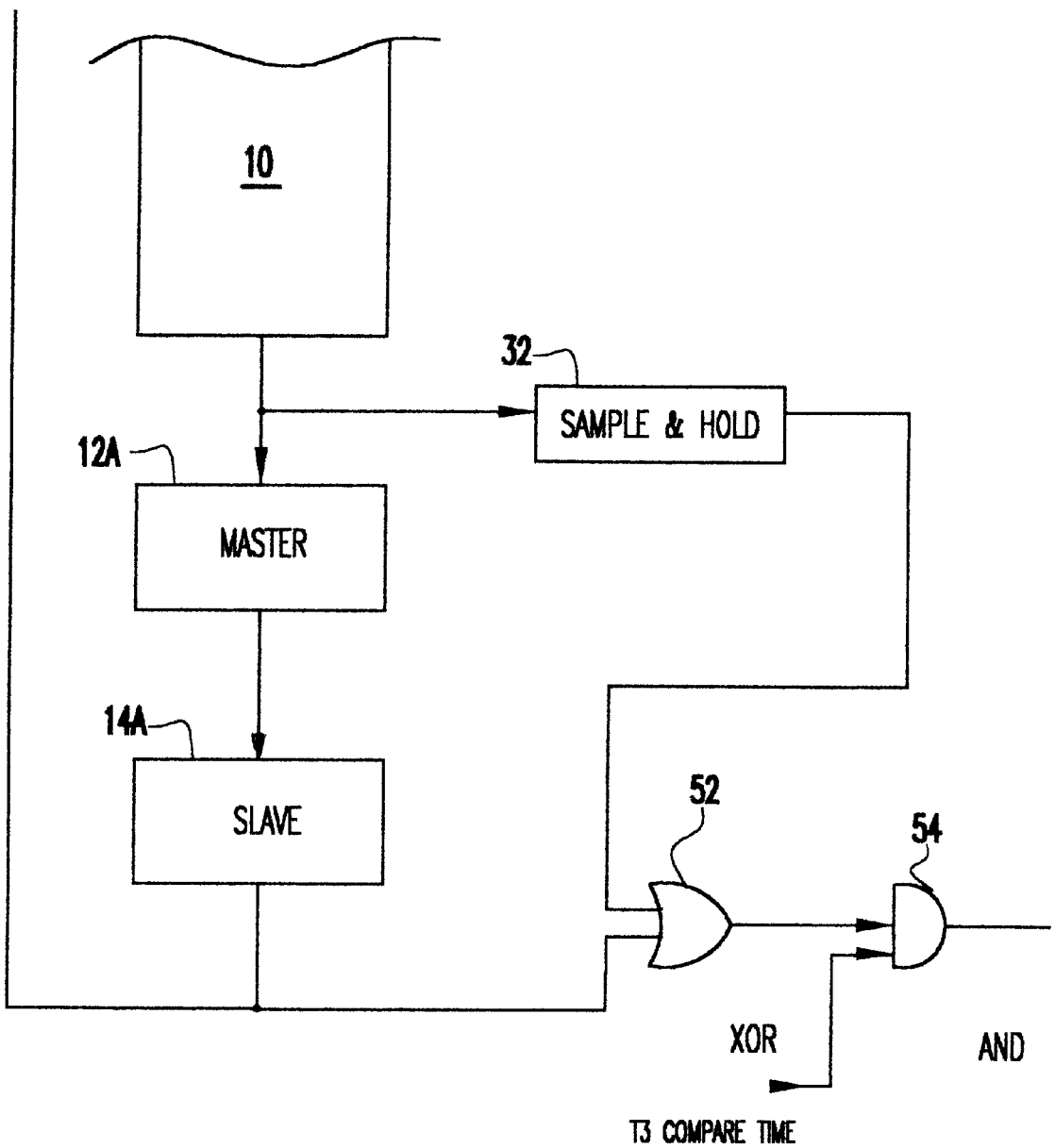

FIG. 5B shows the two detection features of FIG. 5A combined. In this illustration, the sampled input to the master latch is compared by exclusive OR (XOR) circuit 52 to the contents of the slave latch 14a for the time duration T3.

Today's system clocks run around 500 MHz. The smallest simplest logic gates with no power buffering and light loading operate at about 40 psec logic delay. With power buffering, the stage delay is about twice that, or close to 80 psec. Future extrapolations of CMOS performance suggest 2 GHz (giga-Hertz) clocks with 15–30 psec stage delays. The sampling delay of approximately 100 psec thus remains a small fraction of the system clock. Future technologies may further shrink the 100 psec soft error transient period; however, this period will probably not keep pace with logic gate delay.

Figure 6A:
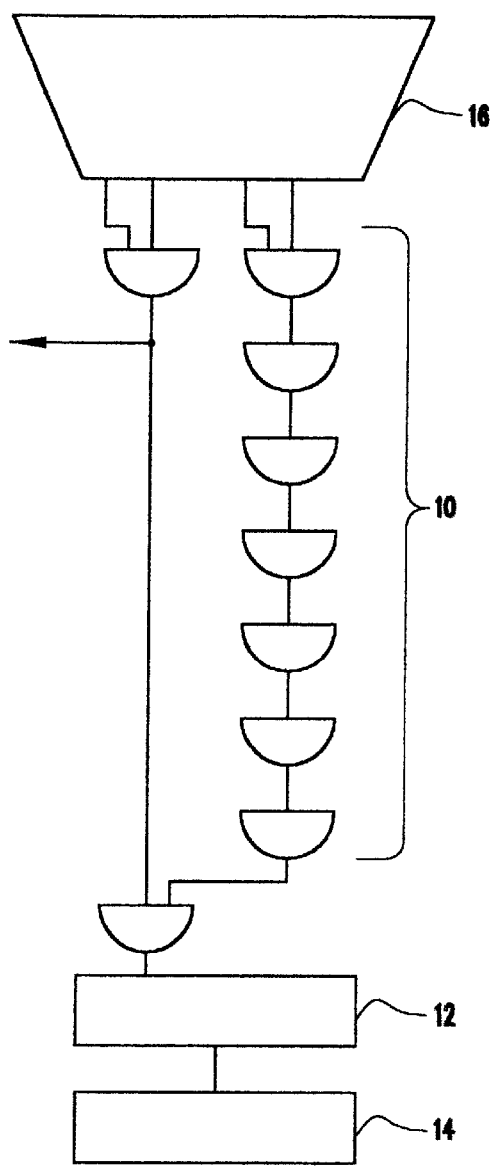
FIGS. 6A and 6B are block and logic diagrams showing, respectively, a hazard and the solution of a potential race condition.

We conclude that race conditions will be a concern but not an important concern to the implementation of this invention. FIG. 6A illustrates a potential race condition. In this example, the combinatorial logic block 10 has two paths, one of which comprises a single gate delay and the other of which comprises a seven gate delay. In actuality, there will be a number of logic paths generally represented by the second of the two logic paths shown in FIG. 6A. Thus, one logic path is far shorter than any of the others. As a result, a race hazard exists in this path. The sample and hold function requires the input to the master latch to be sampled approximately 100 psec after that latch is set. However, the slave latch has the opportunity to change this node prematurely via the short path. The short path must remain short to satisfy another path in another combinatorial logic block (not shown).

Figure 6B:
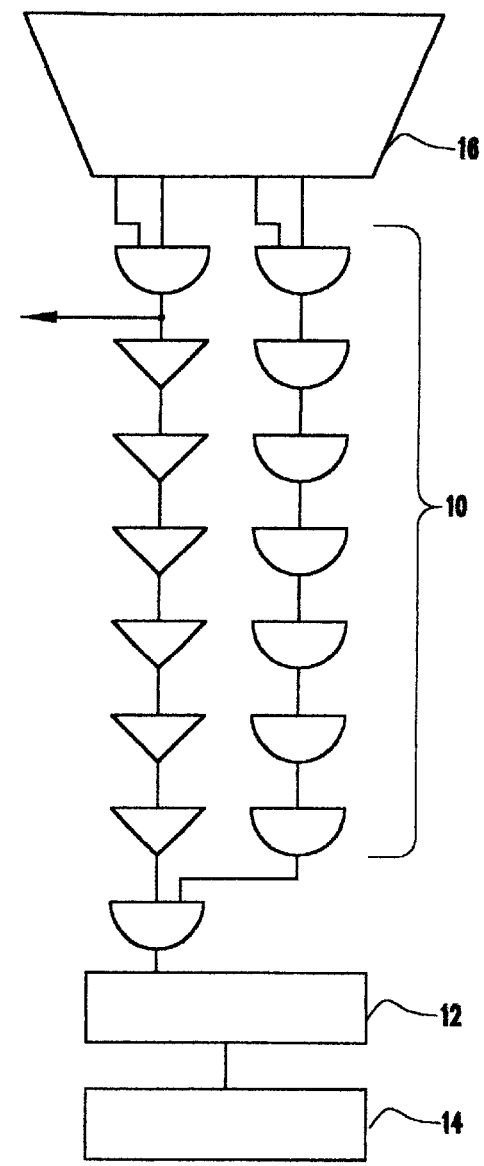

FIG. 6B shows the solution. The "critically short" path is lengthened but only within the hazardous combinatorial logic block; thus determining the race condition in favor of proper operation of the invention.

Error detection alone is not sufficient for many applications. Some form of system recovery is also desirable once an error is detected. Fortunately, a whole host of literature exists for addressing this problem. These solutions require only that memory be uncorrupted. As noted earlier, error correction codes already exist to prevent this from happening. The recovery may consist of simply restarting the program with the original data. More sophisticated systems use a technique called "journaling" in which partial results are stored for future reference in the event of a system error.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A circuit for detecting transients comprising:

a logic block;

a master latch which receives data from said logic block on a data line;

a slave latch which receives data from said master latch on said data line;

a first sample and hold circuit coupled to said data line between said master latch and said slave latch for sensing a first signal on the data line at a first point in time;

a second sample and hold circuit coupled to the data line between said logic block and said master latch for sensing the first signal on the data line at a second point in time such that a time difference between said first and second points in time is small enough so that the first signal is still present on the data line in the absence of a perturbation event and such that the time difference between said first and second points in time is large enough so that any such perturbation event is resolved; and a compare circuit coupled to the first and second sample and hold circuits for comparing the sending of the first signal by the first and second sample and hold circuits and for generating an error signal in response to a non-compare.

2. The circuit for detecting transients of claim 1, wherein said second point in time is equal to said first point in time plus sufficient time for an atomic event perturbation to resolve.

3. The circuit for detecting transients of claim 2, wherein said second point in time is equal to said first point in time plus approximately 100 psec.

4. The circuit for detecting transients of claim 1, wherein said compare circuit is an exclusive OR circuit.

5. The circuit for detecting transients of claim 4, wherein the data line comprises a plurality of data lines and further comprising a plurality of first and second sample and hold circuits and a plurality of exclusive OR circuits, one for each data line, and an OR gate receiving outputs from each of the exclusive OR circuits.

6. The circuit for detecting transients of claim 4, further comprising:

a second exclusive OR circuit connected to the date line at an output of the slave latch and to an output of the first sample and hold circuit; and an AND gate connected to the output of the second exclusive OR circuit and gated at a third point in time.

7. A method for detecting transients, comprising the steps of:

sampling a data line multiple times during a known interval of time wherein a datum of the data line should be stable, said sampling step being performed by a first sample and hold circuit which samples said data line at a location between master and slave latch, and by a second sample and hold circuit which samples said data line at a location between said master latch and a logic block, wherein said data line is organized to transmit data from said logic block to said master latch and then to said slave latch, and wherein said sampling is performed such that a time difference between samplings is small enough so that a signal is still present on the data line in the absence of a perturbation event and such that the time difference between said samplings is large enough so that any such perturbation event is resolved;

comparing samplings generated in said sampling step; and outputting an error signal if the samplings generated in said sampling step do not compare.

8. The method for detecting transients of claim 7, wherein a time difference between samplings of at least two of said multiple samplings is of sufficient time for an atomic event perturbation to resolve.

9. The method for detecting transients of claim 8, wherein said time difference is greater than 100 psec.

10. The method for detecting transients of claim 7, wherein the step of comparing samplings is performed with an exclusive OR circuit.

11. The method for detecting transients of claim 10, wherein the signal line comprises a plurality of data line and further comprising the steps of:

sampling each of said plurality of signal lines at first and second points in time;

comparing sampling from each of said signal lines; and logically summing outputs of the comparing step.

12. The method for detecting transients of claim 10, further comprising the steps of:

comparing a signal on the data line at an output of said slave latch and to the signal sampled by said first sample and hold circuit; and gating an output of the second comparing step at a third point in time.

* * * * *